FABRICATION OF SEMICONDUCTOR DEVICE

Original Filed April 3, 1964 2 Sheets-Sheet 1

INVENTORS
RICHARD L. GOLDMAN
WILLIAM R. KRITZLER
VICTOR C. SIRVYDAS

BY Franz D Prager

ATTORNEY

INVENTORS
RICHARD L. GOLDMAN
WILLIAM R. KRITZLER
VICTOR C. SIRVYDAS
BY
Frank D Prager
ATTORNEY 3,389,457
FABRICATION OF SEMICONDUCTOR DEVICE Richard L. Goldman, Chalfont, Pa., William R. Kritzler, Newton Center, Mass., and Victor C. Sirvydas, Hatboro, Pa., assignors to Philco Ford Corporation, a corporation of Delaware Original application Apr. 3, 1964, Ser. No. 357,087, now Patent No. 3,283,218, dated Nov. 1, 1966. Divided and this application Feb. 16, 1966, Ser. No. 544,048
1 Claim. (Cl. 29—580)

This is a division of application Ser. No. 357,087 filed Apr. 3, 1964 by the present applicants, now Patent No. 3,283,218.

This invention has to do with mesa type semiconductor devices, particularly high frequency diodes. It relates to a method of constructing such devices, complete with semiconductive blank, mesa thereon, and metal connector wire bonded thereto. It also relates to new mesa structures.

According to one aspect thereof, the invention is an improvement over the technique disclosed by Kritzler and Sirvydas, two of the present co-inventors, in application Ser. No. 348,071, filed on Feb. 28, 1964, now Patent No. 3,286,340. The Kritzler-Sirvydas unit (usually a single diode) has a group of connector wires the upper ends of which are combined into an integral "spider" terminal for effective connection to a solder stud or the like. Our invention and improvement has to do with the construction of the mesa surface region, connecting the lower end of any such wire to the diode.

Whether it be combined with the Kritzler-Sirvydas technique or not, our present invention has the general objective of promoting high frequency operation of a semiconductor unit. It is known that such operation requires semiconductor junction regions of minute dimensions and which are most accurately indexed with overlying bonding areas, throughout the extent thereof. Mesa techniques were heretofore developed with a view toward compliance with such requirements; however, it was both difficult and expensive to form the minute junction area of a mesa and accurately to index the outlines thereof with those of an overlying connector bonding region. It is an object of our invention to overcome these problems and thus to provide an improved mesa-forming technique.

This has been achieved by establishing, preliminary to the mesa formation, a nailhead or other bonding structure, securing a thin connector wire to a semiconductor surface, then using said bonding structure as an etch resist element to form the mesa, and finally retaining said bonding structure as a mesa connector element. The new technique and its results and advantages are more fully described in the specification which follows.

Figure 1:
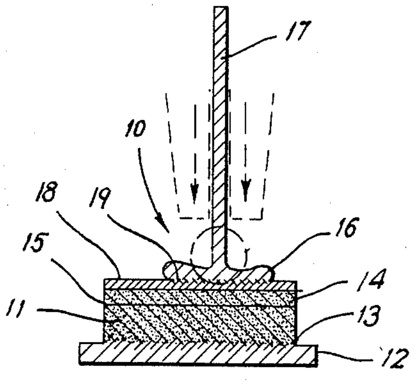
Figure 2:
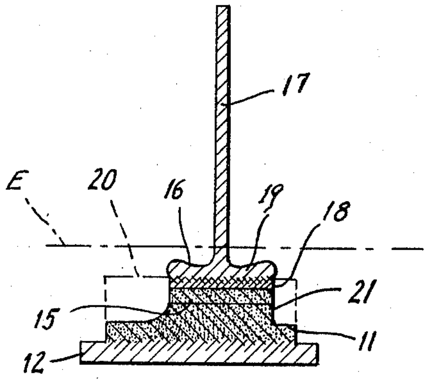
Figure 4:
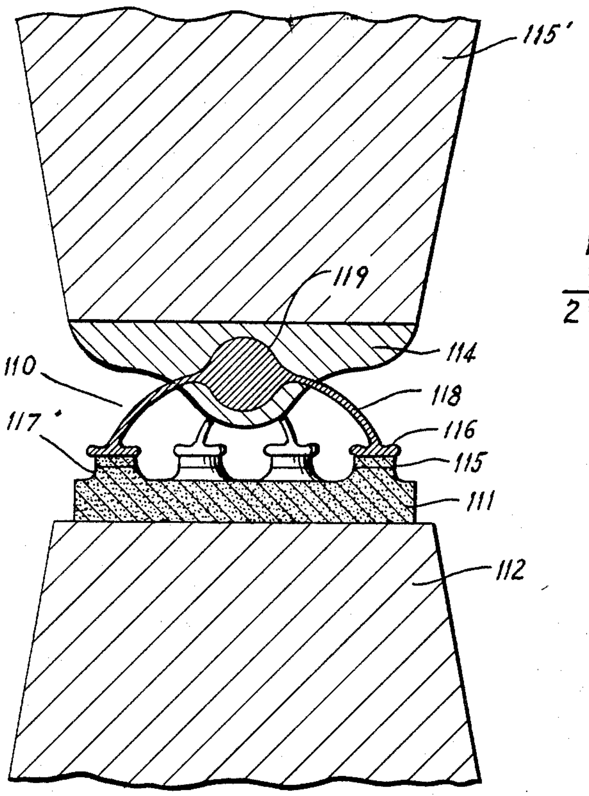
Figure 3:
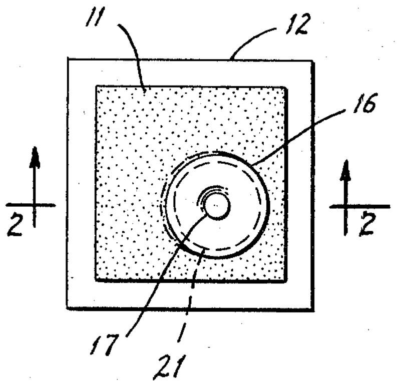

In the drawing appended hereto, FIGURES 1 and 2 are cross-sectional elevational views schematically showing two successive stages in a fabrication process utilizing this invention and applied to a single diode element. FIGURE 3 is a plan view of the structure of FIGURE 2. FIGURE 4 shows a modified diode, also embodying the invention, in a sectional view otherwise similar to that of FIGURE 2. The section of FIGURES 1 and 2 is taken along line 2—2 in FIGURE 3 and the section of FIGURE 4 is taken along a similar line taken through a larger diode having a plurality of mesas thereon.

FIGURES 5 to 9 are cross-sectional elevational views schematically illustrating successive stages in a process for fabricating a diode of the type shown in FIGURE 4. FIGURE 10 is a block diagram of the latter process.

Referring first to FIGURE 1, the new process serves to form an improved bonding and mesa structure 10 on a semiconductor 11, secured to a suitable support 12 as indicated at 13. Initially, minute amounts of suitably chosen impurities are diffused into an exposed planar surface of the semiconductor to form a diffused region 14, divided from the remainder of the semiconductor by a junction region 15. In order to facilitate formation of a nailhead bond 16, connecting a wire 17 to the diffused region 14, a film 18 of silver or chromium or the like, or of laminations of such metals, is formed on the exposed surface of that region and connector wire 17, preferably of gold, is then bonded to the top surface of that film. These diffusing, film-forming, and wire-attaching operations are known by themselves. According to the invention they are performed prior to the formation of a mesa, and the nailhead or thermocompression bonding element 16, integral with connector wire 17, is then utilized in the formation of the mesa.

Although an attempt is usually made to locate and dimension such nailhead with considerable accuracy, it is unavoidable that some irregularity occurs. For instance, FIGURE 3 shows nailhead 16 in a position slightly eccentric to diode body 11, and also shows the outline of the nailhead in only approximately circular form, this outline being shown as generally round but slightly irregular in one arcuate portion thereof.

The thermocompression process, applied in forming nailhead 16, can be performed for instance by flattening a small bead initially provided at the lower end of wire 17, against the exposed semiconductor surface, as is suggested by broken lines in FIGURE 1. A bond 19 is thus formed between the underside of nailhead 16 and the formerly exposed semiconductor surface.

Pursuant to this forming of nailhead 16, and as indicated in FIGURE 2, the process according to the invention comprises application of an etchant (surface schematically shown at E) to the nailhead and the surrounding and exposed semiconductor surface 20. The etchant is chosen to attack the metal film and semiconductor but not the wire metal, or at least not to attack the latter to the extent of removing significant portions thereof. The etchant thus forms a mesa 21, while leaving nailhead 16 and bond 19 thereof intact.

The process results in forming a mesa exactly complying with the preformed nailhead 16 and bond 19 and underlying the same. In FIGURE 3 the outline of this mesa is shown by a broken line within the outline of nailhead 16. The mesa fully complies with the nailhead as to location thereof and also as to exact configuration thereof, including the generally round formation with local non-circular outlines as indicated in the upper left-hand portion of the nailhead. By means of this arrangement the invention provides a uniquely close approach to perfection with regard to coincidence between wire bonding and mesa junction areas 15, 19 FIGURE 2, thereby also providing, for instance, exactly predetermined electric capacity, reverse current, and related characteristics.

A great variety of materials can be used in the new process. For example, a silicon (Si) diode 11 can be provided with an impurity region 14 by exposure to vapors of antimony (Sb) followed by boron (B) and can then be connected by wires 16 of gold (Au). In this case the etching can be done for instance by a mixture of one part concentrated hydrofluoric acid (HF) and one part concentrated nitric acid ($HNO_3$), as a fast etchant. It will be understood by persons skilled in this art that a great variety of other semiconductors, impurities, etchants, and connector metals can be used, and that different types of electric operation can be provided thereby. Similarly the dimensions of the unit and of the component parts thereof can differ widely, but it might be mentioned that gold wire 17 can have for instance a diameter of 1 to 2 mils, in which case the diameter of nailhead 16 can be about 5 to 6 mils and a typical concentric mesa 17 can then have a diameter of about 4 to 5 mils. Details of this kind can be varied. The important point is that an effective semiconductor region 15, 19 is provided wherein capacitance and related characteristics are close to the theoretical values, applicable in each individual case.

Referring now to the diode of FIGURE 4, this modified embodiment of our invention comprises multiple wire connecting apparatus 110 of the type disclosed in the Kritzler-Sirvydas application. It uses, accordingly, a plurality of metallic connector wires 118 joined into an integral spherical body 119 for connection to solder bead 114 on stud 115. In keeping with the present invention, the connecting wires have their nailheads 116 bonded to mesas 117, on a top surface of semiconductor body 111 carried by stud 112. Each nailhead-mesa bond closely and accurately overlies the mesa junction. The outlines coincide even in the event of slight irregularities of placement and form, similar to those of FIGURE 3.

Figure 5:
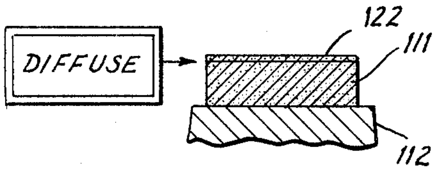
Figure 6:
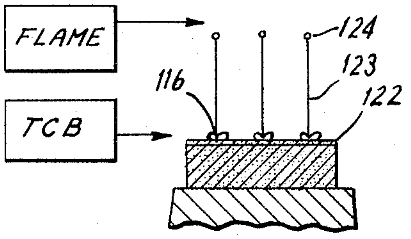
Figure 7:
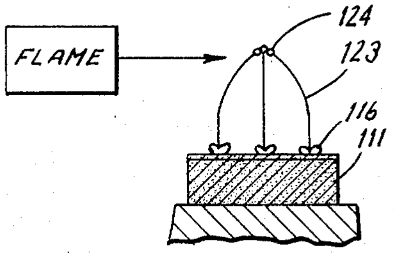

The process of forming this multiple mesa and connector unit can begin, as indicated in FIGURE 5, with the conventional step of diffusing impurities into diode body 111 to form impurity layer or film 122. According to the invention the process then continues by bonding the group of connector wires, initially in upstanding form as shown at 123, to film 122 by nailheads or compression bonds 116, as is indicated in FIGURE 6. Preferably the free wire ends are provided with small, integral beads 124, for instance by flame-cutting the wires; it is believed that for purposes of the present disclosure details of such operation need not be described, suitable steps being taught in the copending disclosure. While only a few connector wires are shown, greater numbers of such wires can be used as will be understood by persons skilled in this art. Next, as shown in FIGURE 7 and as further described in said copending Kritzler-Sirvydas case, wires 123 are bent to provide a cluster of beads 124, which are then flame treated to coalesce the same into a small, unitary spherical body. Major upper portions of the wires are then absorbed and fused into this body, so that ultimately, as shown in FIGURE 8, a larger sphere 119 is disposed more closely adjacent the semiconductor surface, with relatively short wires 118 extending from that surface into the sphere.

Figure 8:
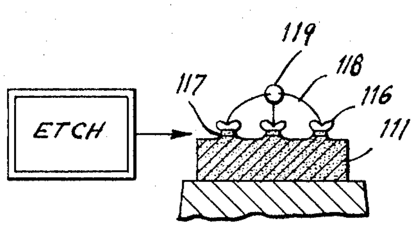

In further and particular accordance with the invention, the diode, sphere and wire unit is next exposed to etchant, as indicated in FIGURE 8, thereby forming the complete group of mesas 117 exactly indexed with respect to nailheads 116. The simplicity and accuracy of the new method is particularly useful in this forming of an array of mesas and connectors. Heretofore, wax or the like was used as a mask-forming etch-resist material, controlling the etching of mesas. Such resist was applied to an otherwise bare semiconductor surface, usually by a microscopic photolithographic process. An attempt was made to apply the mask in a predetermined configuration complying closely to the desired mesa pattern. When mesas had thus been formed, a further attempt was made, usually with a similar effort toward accuracy, to apply and bond connecting wires one to each mesa. The precision attainable in the ultimate product was very limited although the process was very complex. The new gold wire nailheads 116, by contrast, yield a more accurate product by a simpler process, when utilized as a group of resist elements in accordance with the invention. In addition the new resist need not be removed pursuant to such use thereof.

In order to appreciate the accuracy of the new technique it must be noted that the diagrams of FIGURES 1 to 9 are very substantially enlarged from the actual size of the semiconductor device, typical actual dimensions being about one-hundredth to one-fiftieth of those appearing in these drawings. The microscopic placement and bonding of wires is likely to produce a number of irregularities such as those shown in FIGURE 3; nevertheless the use of nailheads as etch resistant elements achieves substantially perfect alignment of nailheads and mesas.

Figure 9:
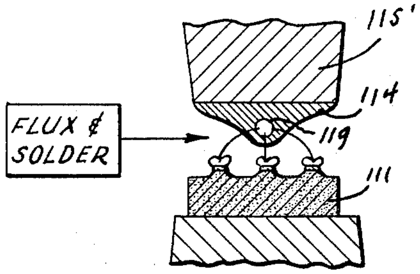
Figure 10:

Ultimately, sphere 119 can be embedded in solder tip 114 as indicated in FIGURE 9 and more fully shown in FIGURE 4 and discussed in the Kritzler-Sirvydas application.

As initially noted a new and improved mesa connecting technique is provided by this invention. As applied to multiple connector diodes the technique is most fully represented by FIGURES 6 to 9 and the sequence of operations is additionally outlined in FIGURE 10. As clearly shown in the latter figure, the process begins with an impurity diffusing operation, followed by a whisker forming and joining process, particularly using nailhead bonds and which is utilized not only to provide the ultimately needed connectors but in accordance with the invention also to provide a novel etch resist. FIGURE 10 accordingly continues with a mesa forming operation of peculiar kind wherein these nailheads are utilized as etch resist means. The device can then be completed by various operations, for instance by the stud attaching operation noted in FIGURE 10 and more fully shown in FIGURE 9.

By virtue of the substantially perfect conformity of nailheads and mesas, provided hereby, irregularities of junction characteristics of different junctions 15 (FIGURES 1 to 3) or 115 (FIGURE 4) are substantially avoided, even when the diode or other semiconductor device is operated at extremely high frequencies.

While only two ways of performing the new process, and corresponding products, have been described in full the invention contemplates such variations and modifications as come within the scope of the appended claim.

We claim:

1. A method of fabricating semiconductive diodes comprising the steps of: preparing surfaces of semiconductive bodies for use in mesa semiconductors; providing thin metal wires with small beads at ends thereof; bonding such wires by their said beads to said surfaces; thereafter applying to said surfaces, with wires so bonded thereto, an etchant capable of removal of semiconductive material but not of wire metal, several of said wires being provided for each semiconductive body and bonded thereto, so that said applying of etchant produces an array of mesas on said body, each mesa having a wire bonded thereto; said method also including the steps of providing each of said wires with a bead at its free end, fusing the several beads into a single sphere, and attaching the sphere to a solder stud before applying said etchant.

References Cited

UNITED STATES PATENTS

| | | | |
|---|---|---|---|
| 3,006,067 | 10/1961 | Anderson et al. | 29—590 X |
| 3,038,085 | 6/1962 | Wallmark et al. | |
| 3,140,527 | 7/1964 | Valdman et al. | 29—580 |
| 3,286,340 | 11/1966 | Kritzler et al. | 29—591 X |

WILLIAM I. BROOKS, *Primary Examiner*.